US012787766B2

(12) United States Patent
Chigullapalli et al.

(10) Patent No.: US 12,787,766 B2
(45) Date of Patent: Nov. 3, 2026

(54) HEAT SINK WITH HEAT PIPE HANDLE PORTION

(71) Applicant: AMD Design, LLC, Wilmington, DE (US)

(72) Inventors: Sruti Chigullapalli, Seattle, WA (US); Atharva Rahane, Jersey City, NJ (US); Nicholas Keator, Lincoln Park, NJ (US); David Liang, West Orange, NJ (US)

(73) Assignee: AMD DESIGN, LLC, Wilmington, DE (US)

( * ) Notice: Subject to any disclaimer, the term of this patent is extended or adjusted under 35 U.S.C. 154(b) by 181 days.

(21) Appl. No.: 18/415,881

(22) Filed: Jan. 18, 2024

(65) Prior Publication Data

US 2025/0239503 A1 Jul. 24, 2025

(51) Int. Cl.
*H10W 40/22* (2026.01)
*H10W 40/73* (2026.01)

(52) U.S. Cl.
CPC ......... *H10W 40/226* (2026.01); *H10W 40/73* (2026.01)

(58) Field of Classification Search
CPC . H01L 23/473; H01L 23/427; H01L 23/3672; H01L 23/467; H01L 23/367; H01L 23/3675; H01L 23/13; H01L 24/20; H01L 23/433; F28D 15/0275
See application file for complete search history.

(56) References Cited

U.S. PATENT DOCUMENTS

| | | | | | |
|---|---|---|---|---|---|
| 4,453,753 | A * | 6/1984 | Fayerman | E05B 65/104 292/357 |
| 5,673,028 | A * | 9/1997 | Levy | G06F 11/326 324/555 |
| 5,932,925 | A * | 8/1999 | McIntyre | H01L 23/4093 174/16.3 |
| 6,021,044 | A * | 2/2000 | Neville, Jr. | G06F 1/20 174/15.2 |
| 6,151,217 | A * | 11/2000 | Thomsen | H01L 23/467 174/16.3 |
| 6,239,417 | B1 * | 5/2001 | Vidmar | H05B 6/6494 219/730 |
| 6,252,771 | B1 * | 6/2001 | Jordan | H01L 23/473 361/689 |
| 6,374,906 | B1 * | 4/2002 | Peterson | H01L 23/3672 165/185 |
| 2007/0068936 | A1 * | 3/2007 | Wu | A47J 45/068 219/687 |
| 2008/0115915 | A1 * | 5/2008 | Chen | H01L 23/427 165/104.33 |
| 2022/0005328 | A1 * | 1/2022 | Gupta | G01K 11/165 |
| 2024/0040748 | A1 * | 2/2024 | Lunsman | H01L 23/433 |

* cited by examiner

*Primary Examiner* — Adam B Dravininkas
(74) *Attorney, Agent, or Firm* — SCULLY, SCOTT, MURPHY & PRESSER, P.C.

(57) ABSTRACT

A heat sink is provided that includes a plurality of heat sinks and a plurality of fins in a stacked configuration. The heat pipes are operable to receive and transfer heat away from a computing component. The fins form a central aperture extending along a vertical axis. At least one of the heat pipes includes a handle portion operable to extend across the central aperture to be grasped by a user.

18 Claims, 13 Drawing Sheets

600

| Air Flow | | Conventional Handle Heatsink (HS) | Presently Disclosed HS | Improvement |
|---|---|---|---|---|
| 100 CFM | HS Base Temperature | 80 C | 66 C | 14 C |
| | Handle Temperature | 37 C | 52 C | |
| 150 CFM | HS Base Temperature | 71 C | 61 C | 10 C |
| | Handle Temperature | 36 C | 47 C | |
| 200 CFM | HS Base Temperature | 66 C | 58 C | 8 C |
| | Handle Temperature | 35 C | 44 C | |

FIG. 6

HEAT SINK WITH HEAT PIPE HANDLE PORTION

FIELD

The present disclosure relates generally to a heat sink with a handle portion formed from one or more heat pipes.

BACKGROUND

Computing systems such as modular servers and/or information handling systems, often need cooling systems to lower a temperature of computing components such as central processing units (CPUs) and/or graphics processing units (GPUs). The computing components operating at temperatures above a threshold can result in performance issues and reliability concerns.

BRIEF DESCRIPTION OF THE DRAWINGS

Implementations of the present technology will now be described, by way of example only, with reference to the attached figures, wherein:

FIG. 6 illustrates a chart showing improvement of temperature of the heat sink compared with the conventional heat sink;

DETAILED DESCRIPTION

Figure 1A:
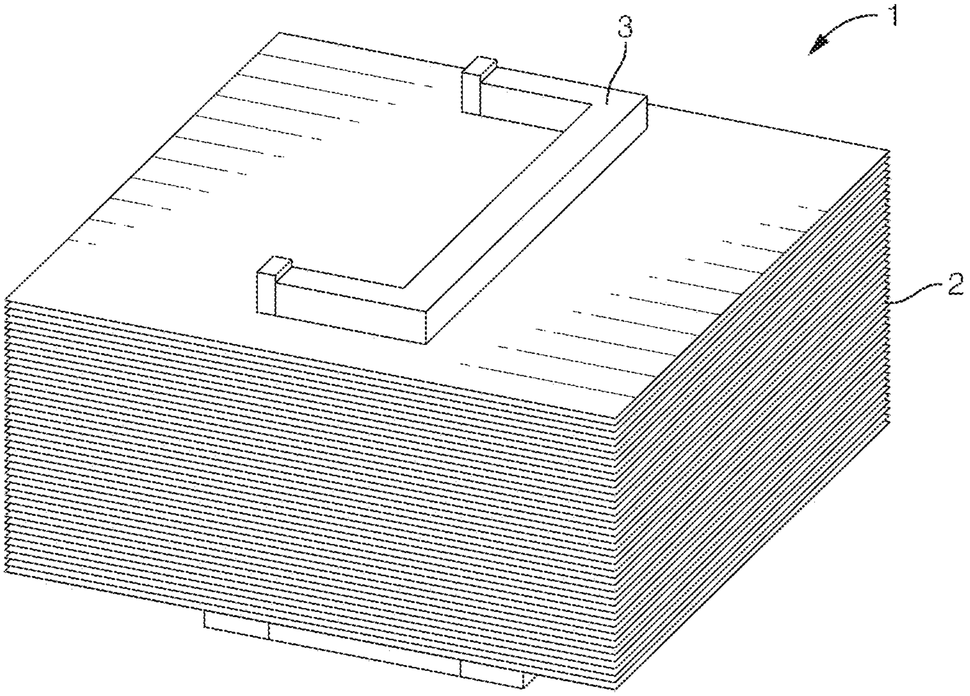
FIG. 1A (Prior Art)
FIG. 1A illustrates a conventional heat sink with a handle extending on top of the fins.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented. The term “coupled” is defined as connected, whether directly or indirectly through intervening components, and is not necessarily limited to physical connections. The term “substantially” is defined to be essentially conforming to the particular dimension, shape or other word that substantially modifies, such that the component need not be exact. For example, substantially cylindrical means that the object resembles a cylinder, but can have one or more deviations from a true cylinder. The term “about” means reasonably close to the particular value. For example, about does not require the exact measurement specified and can be reasonably close. As used herein, the word “about” can include the exact number. The term “near” as used herein is within a short distance from the particular mentioned object. The term “near” can include abutting as well as relatively small distance beyond abutting. The terms “comprising,” “including” and “having” are used interchangeably in this disclosure. The terms “comprising,” “including” and “having” mean to include, but not necessarily be limited to the things so described.

Figure 1B:
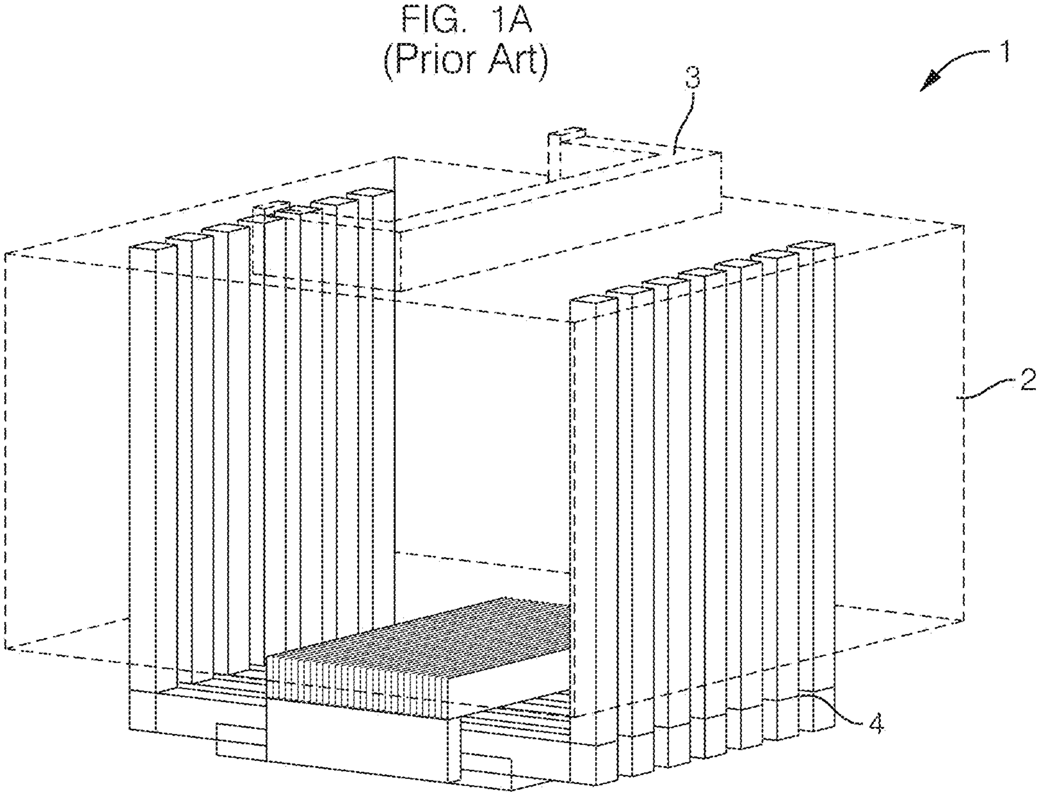
FIG. 1B (Prior Art)
FIG. 1B illustrates a diagram of the conventional heat sink of FIG. 1A.
Figure 1C:
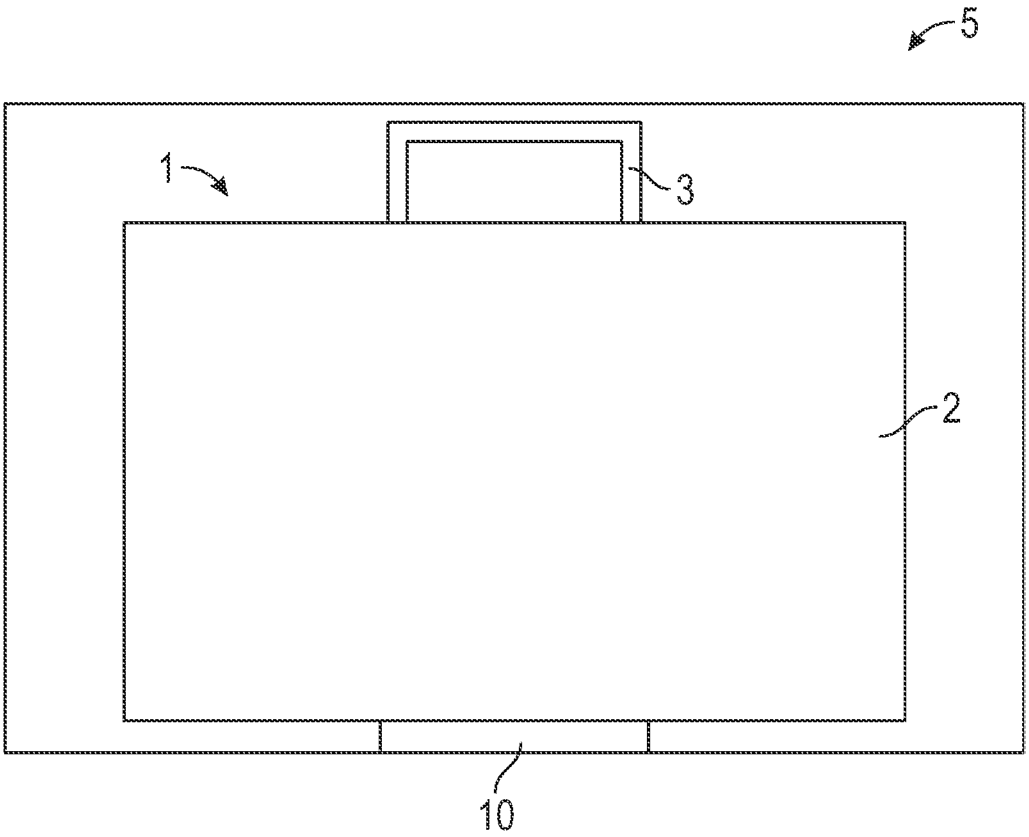
FIG. 1C (Prior Art)
FIG. 1C illustrates the conventional heat sink utilized in a conventional computing system.

Heat sinks can be operable to lower a temperature of a computing component (e.g., central processing unit and/or graphics processing unit). The heat sink can include a handle portion that a user can grasp to lift and/or move the heat sink. For example, as shown in FIGS. 1A and 1B, conventional heat sinks 1 include a traditional meta and/or plastic handle 3 that extends up from the top of the fins 2 of the heat sink 1. Accordingly, conventional heat sinks 1 take up space in the computing system 5, as shown in FIG. 1C. With the conventional handle 3, there is air bypass above the heat sink 1 in the handle space, which leads to a reduction in overall thermal performance of the heat sink 1. For example, the conventional handle 3 requires at least 15 millimeters of space above the heat sink 1 for clearance for the handle 3. Accordingly, the computing system with the conventional heat sink 1 loses fin and/or heat pipe space that implies a waste of potential thermal performance. As power and power density of graphics processing units, accelerated processing units, and/or central processing units are increasing, it is even more important to use the available space in the computing system to maximize thermal performance without compromising on serviceability and also not violating required heat sink specifications.

The presently disclosed heat sink includes a dual function heat pipe handle portion that is mechanically robust and durable, adds thermal performance at a lower air flow, and also is safe to handle during a service event. The heat sink utilizes a heat pipe as both a handle as well as a heat transfer component. In comparison, conventional heat sinks 1 utilize a separate handle feature which reduces usable space for heat dissipation. The lack of handle on top of the heat sink (as in conventional heat sinks 1) reduces the bypass of air and makes better of us available the space in the computing system. The additional space that is now available in comparison with conventional heat sinks 1 can allow for extra fins to be provided on the heat sink.

In at least one example, to accommodate safe handling by a user, for example during service, a heat indicator, such as a thermochromic indicator can be provided. For example, the heat indicator can be provided on at least a portion of the handle portion. The heat indicator can alert the service personnel that the handle portion, and in some examples the heat sink, is within a temperature range deemed safe to handle.

The disclosure now turns to FIGS. 2A-2D, which illustrate an example of a heat sink 100. The heat sink 100 can be operable to transfer heat from a heat source (e.g., a computing component 10, see for example FIG. 2E) to reduce the temperature of the heat source. The computing component 10 can include a graphics processing unit, a central processing unit, etc. Heat transfer can be achieved through any combination of conduction, convection, radiation, etc. The heat sink 100 can include a base 101 with a plurality of fins 102 in a stacked configuration on the base 101 and a plurality of heat pipes 104 in communication with the base 101 and/or the fins 102. The base 101 can be operable to be in thermal contact with the computing component 10. Accordingly, the base 101 can be operable to receive the heat from the computing component 10 and transfer the heat to the fins 102. To be in thermal contact, the base 101 can be in direct contact with the computing component 10. In some examples, to be in thermal contact, the base 101 can be in indirect contact with the computing component 10 but where the base 101 can receive heat from the computing component 10 through one or more intermediate components. For example, the base 101 can be mounted to the computing component 10 with mounting hardware and/or thermal paste. In at least one example, the base 101 can include a flat block or sheet of material with high thermal conductivity. In some examples, the base 101 can have a consistent cross-sectional thickness. In some examples, the base 101 can also be designed to have a cross-sectional profile that optimizes heat transfer for the specific geometry of the computing component 10.

Figure 2A:
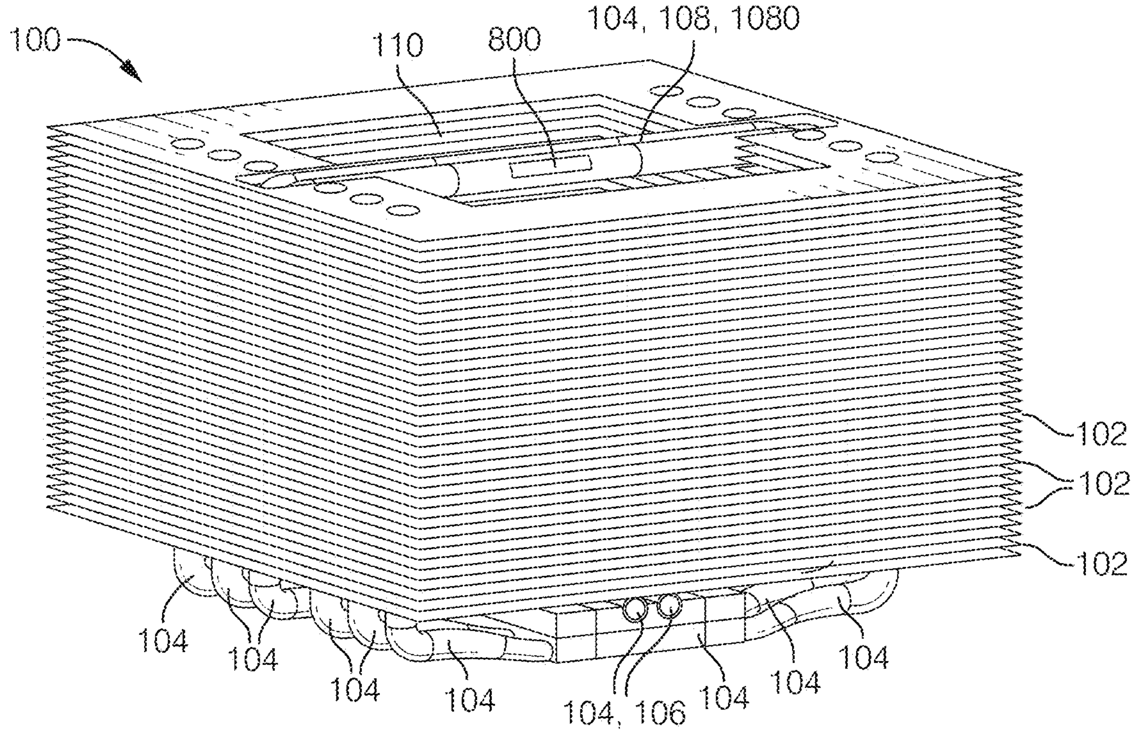
FIG. 2A illustrates a perspective view of a heat sink, according to the present disclosure.
Figure 2B:
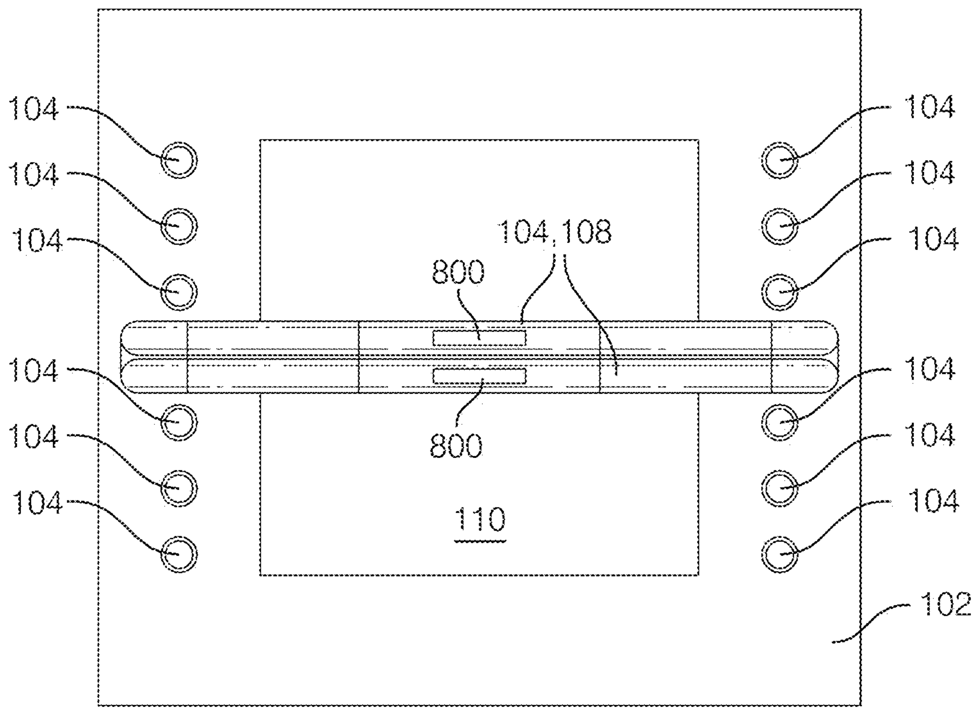
FIG. 2B illustrates a top view of the heat sink of FIG. 2A.
Figure 2C:
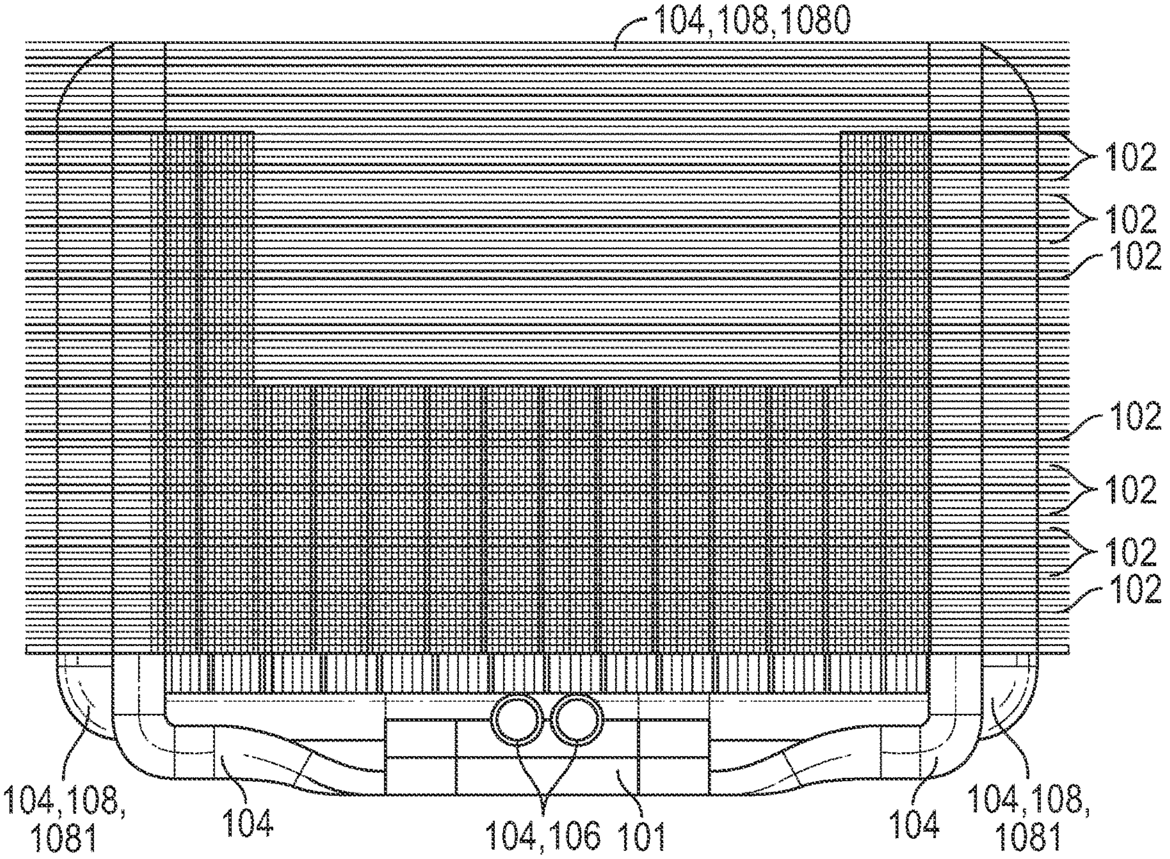
FIG. 2C illustrates a front view of the heat sink of FIG. 2A.
Figure 2D:
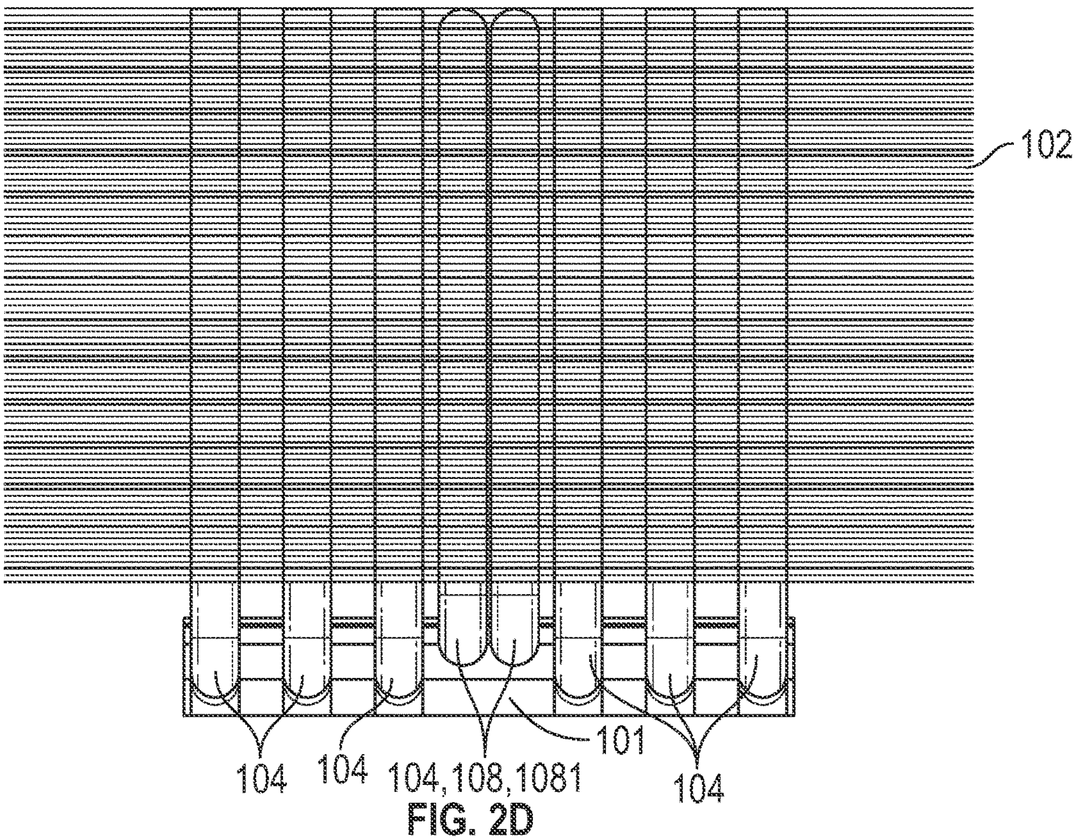
FIG. 2D illustrates a side view of the heat sink of FIG. 2A.

In at least one example, a plurality of heat pipes 104 can be operable to receive and transfer heat away from the computing component 10. The heat pipes 104 can be in thermal contact with the base 101 such that the heat pipes 104 can receive heat from the base 101 and transfer the heat away from the base 101. The base 101 can be coupled with the heat pipes 104 to be in thermal contact with one another. Accordingly, the base 101 can be operable to transfer heat from the computing component 10 to the heat pipes 104. To be in thermal contact, the heat pipes 104 can be in direct contact with the base 101. In some examples, to be in thermal contact, the heat pipes 104 can be in indirect contact with the base 101 but where the heat pipes 104 can receive heat from the base 101 through one or more intermediate components. In some examples, the heat pipes 104 can be coupled with the base 101. In some examples, the heat pipes 104 can extend from the base 101 in a direction substantially perpendicular to the plane of the base 101. For example, the heat pipes 104 can be operable to extend from the base 101 along a vertical axis. In some examples, as illustrated in FIGS. 2A, 2C, and 2D, the heat pipes 104 can extend from the base 101 substantially parallel with the plane of the base 101 and then curve to extend perpendicularly away from the base 101.

The fins 102 can be operable to increase the surface area for heat transfer. In at least one example, the fins 102 extending from the base 101 can be responsible for the transfer of heat to surrounding fluid. The fins 102 can be designed to optimize the surface area that the heat sink 100 presents to the fluid. The larger the surface area, the faster the heat transfer rate. The fins 102 can be passively cooled via natural convection or actively cooled by forced convection (e.g., a fan).

The fins 102 can be in thermal contact with the base 101 and/or the heat pipes 104 such that the fins 102 can assist in removing heat from the computing component 10 via the base 101 and/or the heat pipes 104. The fins 102 can form an integral part of the base 101 and/or can be attached separately using various techniques, for example, via a compression process. The shape and arrangement of the fins 102 can dramatically improve the heat transfer rate.

In at least one example, the fins 102 can have a thickness between about 0.1 millimeters and about 1 millimeter. In some examples, the fins 102 can have a thickness between about 0.1 millimeters and about 0.5 millimeters. In some examples, the fins 102 can have a thickness about 0.3 millimeters. The fins 102 can have a fins pitch of about 1 millimeter. In some examples, the fins 102 can be at least partially made of aluminum. In some examples, the fins 102 can be any material that have high heat conductivity.

Figure 3:
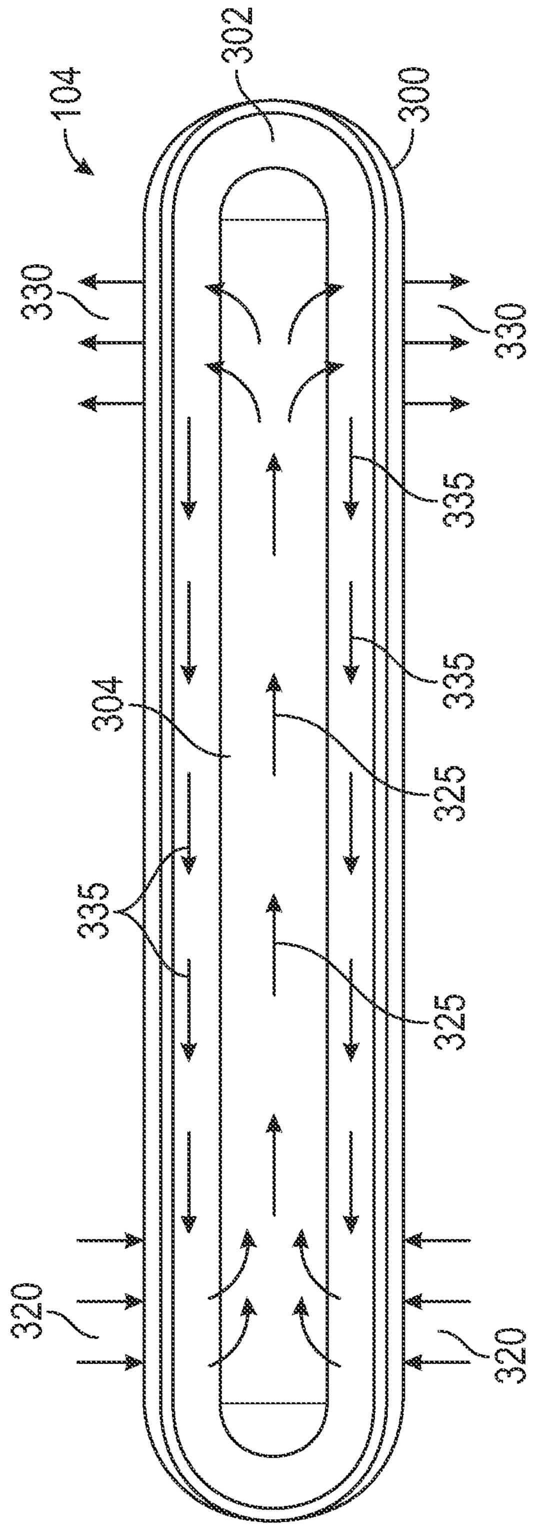
FIG. 3 illustrates a diagram of a heat pipe.

FIG. 3 illustrates a cross-sectional diagrammatic view of a heat pipe 104. The heat pipe 104 can include a surface portion 300, a porous section 302, and a central portion 304. Heat pipes 104 conduct heat through two-phase heat transfer. Heat can be received from a heat source (e.g., computing component 10 and/or base 101) at the evaporation section 320 of the heat pipe 104. The working fluid in the evaporation section 320 can vaporize due to the heat intake, and the vapor 325 flows out of the porous section 302 into and through the central portion 304 towards the condensation section 330. The condensation section 330 can be a portion of the heat pipe 104 that is away from the heat source. At the condensation section 330, the heat transfers out of the heat pipe 104, and the vapor condenses back to liquid 335 after the heat is dissipated. The liquid 335 returns to the evaporation section 320 due to capillary action in the porous section 302.

As shown in FIGS. 2A-2E, the fins 102 form a central aperture 110 extending along a vertical axis. In at least one example, the central aperture 110 formed by the fins 102 can form a pocket 110. In the central aperture 110, there are no fins.

Figure 4:
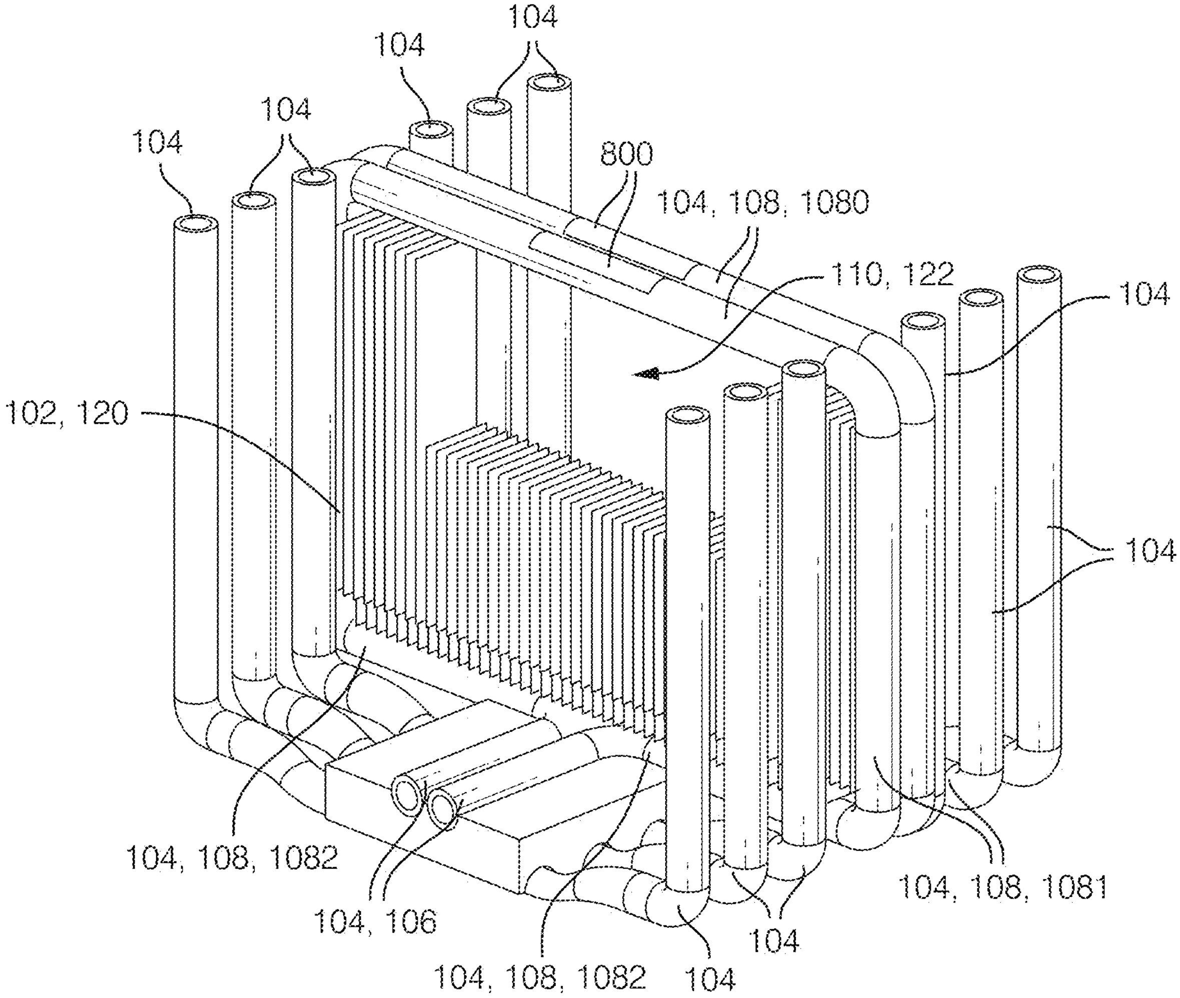
FIG. 4 illustrates the heat sink with the fins omitted.

FIG. 4 illustrates the heat sink 100 with the outer fins 102 omitted. As shown in FIGS. 2A-2E and 4, at least one of the heat pipes 104 includes a handle portion 108 operable to extend across the central aperture 110. As shown in FIG. 4, the heat sink 100 includes 6 traditional heat pipes 104 and 2 heat pipes 104 that form the handle portion 108. The number of traditional heat pipes 104 and heat pipes 104 that form the handle portion 108 can vary without deviating form the scope of the disclosure.

The handle portion 108 can extend along a horizontal axis transverse to the vertical axis of the central aperture 110. For example, the handle portion 108 can extend across the pocket formed by the central aperture 110 such that the handle portion 108 can be graspable by a user. In at least one example, the plurality of fins 102 can include a plurality of central fins 120 operable to be received in the heat pipes 104. The central fins 120 can form a gap 122 in the central aperture 110 underneath the handle portion 108. Accordingly, the heat sink 100 is optimized with a maximum amount of fins 102 to help transfer heat from the computing component 10.

In some examples, the heat pipe(s) 104 that form the handle portion 108 can be coupled with and/or abut the top of the base 101. The heat pipes 104 that form the handle portion 108 can include a horizontal portion 106, 1082 that extends substantially parallel to the handle portion 108 and/or the plane of the base 101, a vertical portion 1081 that extends substantially perpendicular to the horizontal portion 1082 along the vertical axis away from the base 101, and the handle portion 1080 that extends from the vertical portion 1081 horizontally across the central aperture 110. The handle portion 108 of the heat pipe(s) 104 is able to be utilized both as a handle as well as a heat transfer component. The handle portion 108 is mechanically robust and durable and add thermal performance at lower airflow while also being safe to handle during a service event.

Figure 2E:
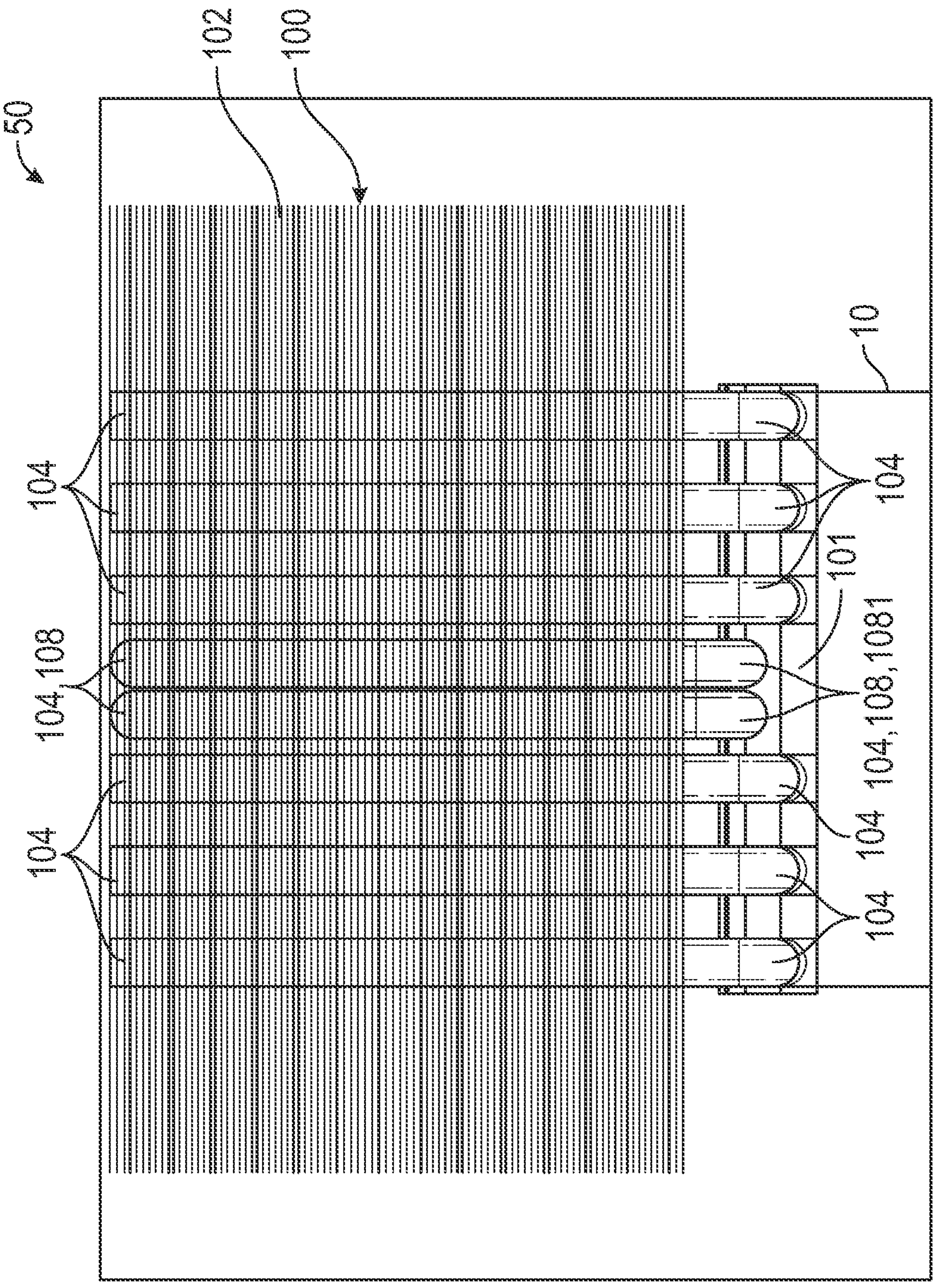
FIG. 2E illustrates the heat sink of FIG. 2A being utilized in a computing system.

The handle portion 108 extends across an upper portion of the pocket 110 (e.g., the central aperture 110) so that the handle portion 108 does not extend past a top fin of the plurality of fins 102. The top fin can be the fin 102 that is opposite the base 101 of the heat sink 100. If the handle portion 108 does extend past the fins 102, the handle portion 108 when being grasped extends a minimal amount (e.g., less than 15 millimeters) to maximize the space in the computing system 50 (for example as shown in FIG. 2E) for fins 102 and/or heat sinks 104. Accordingly, the heat sink 100 can be more effective in removing heat from the computing component 10. For example, the fins 102 can include more than 82 fins in the stacked configuration. In some examples, the heat sink 100 can include between 90 and 110 fins 102 in the stacked configuration.

Figure 5:
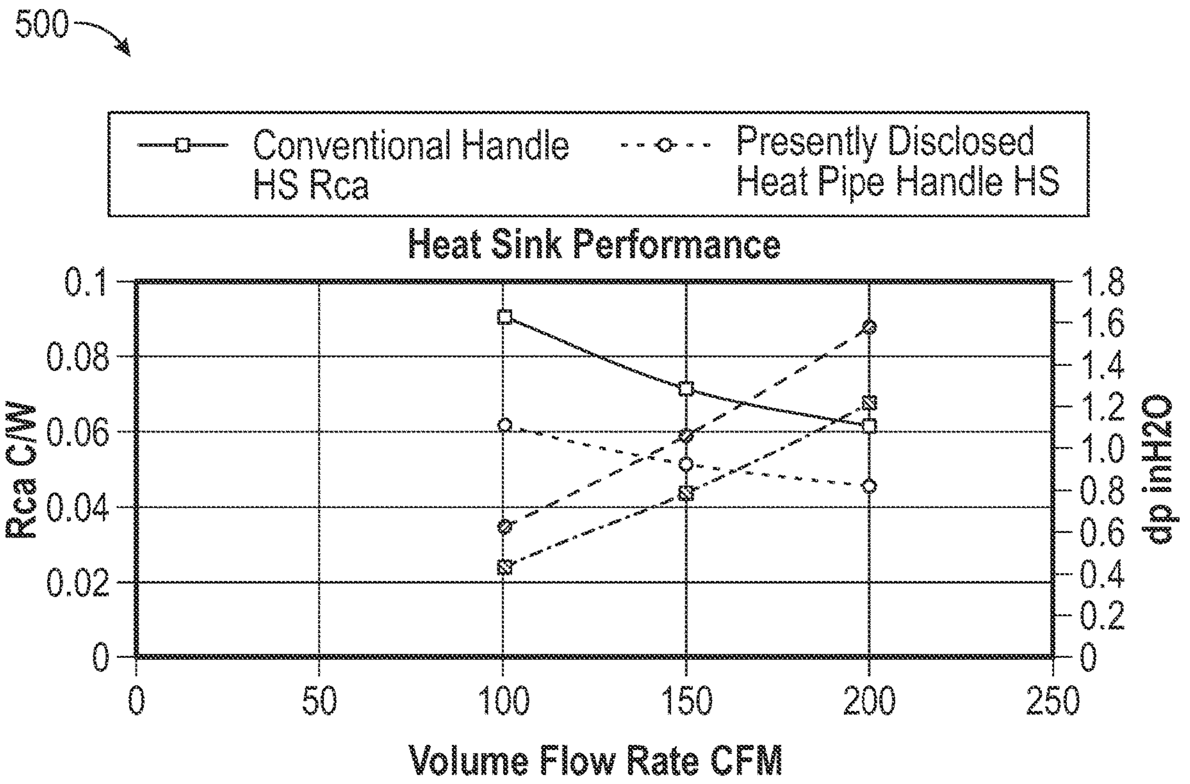
FIG. 5 illustrates a graph showing heat sink performance between the conventional heat sink and the presently disclosed heat sink.

For example, as shown in the graph 500 of FIG. 5 and the chart 600 of FIG. 6, in comparison with the conventional heat sink 1, air bypass is reduced and fin density is increased which results in 8-14 degrees Celsius improvement in heatsink performance with 500W at airflows between 100-200 cfm. This implies, when compared to the conventional heat sink 1, the heat sink 100 performs higher at lower airflows. The fans in the computing system 50 can then be run slower which can lead to improved server efficiency (e.g., fan power percentage) and lower fan noise.

Additionally, during testing of the heat sink 100, under the same loading condition of the handle portion 108, the heat sink 100 showed lower stress and a higher factor of safety than the conventional heat sink 1. For example, the handle portion 108 had a maximum stress of 4.72 MPa which results in a factor of safety of roughly 7. The handle 3 of the conventional heat sink 1 under the same loading conditions had a maximum stress of 12.21 MPa which results in a factor of safety of roughly 1.5.

Figure 7A:
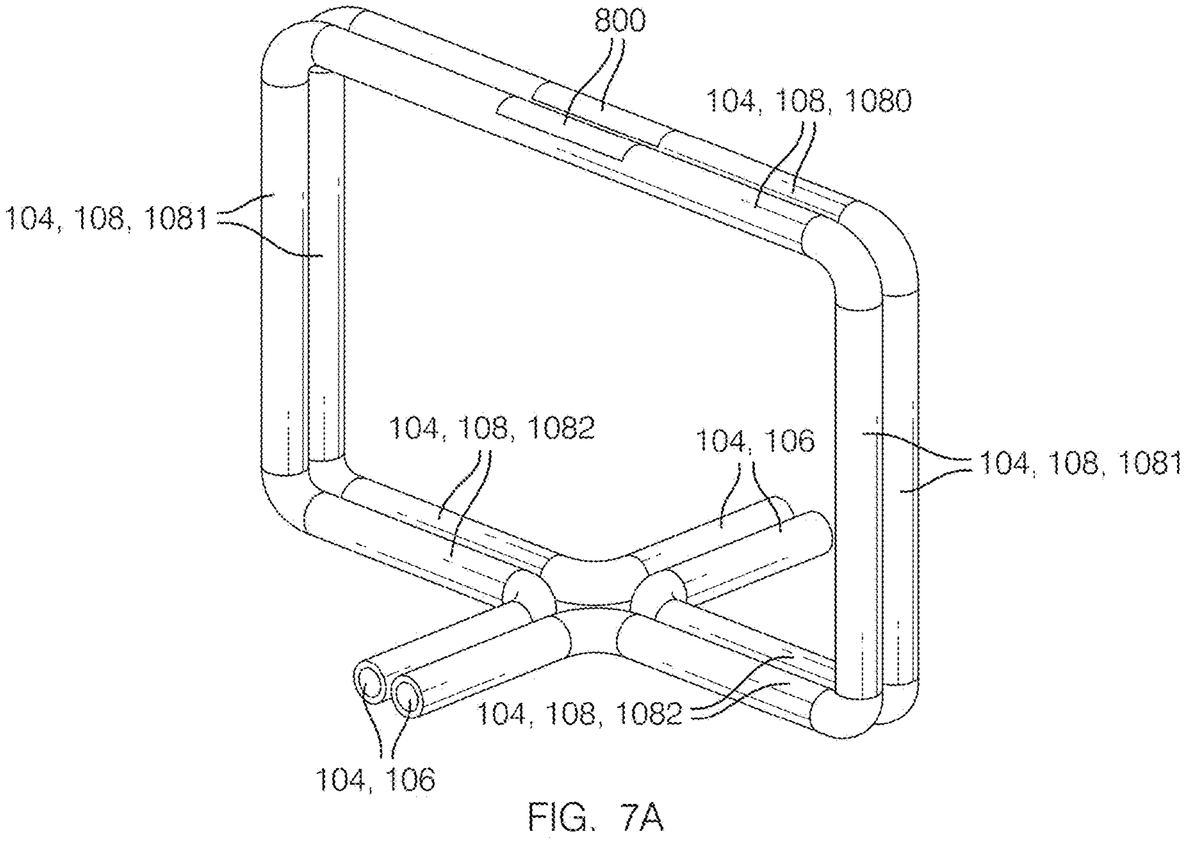
FIG. 7A illustrates heat pipes with a handle portion.
Figure 7B:
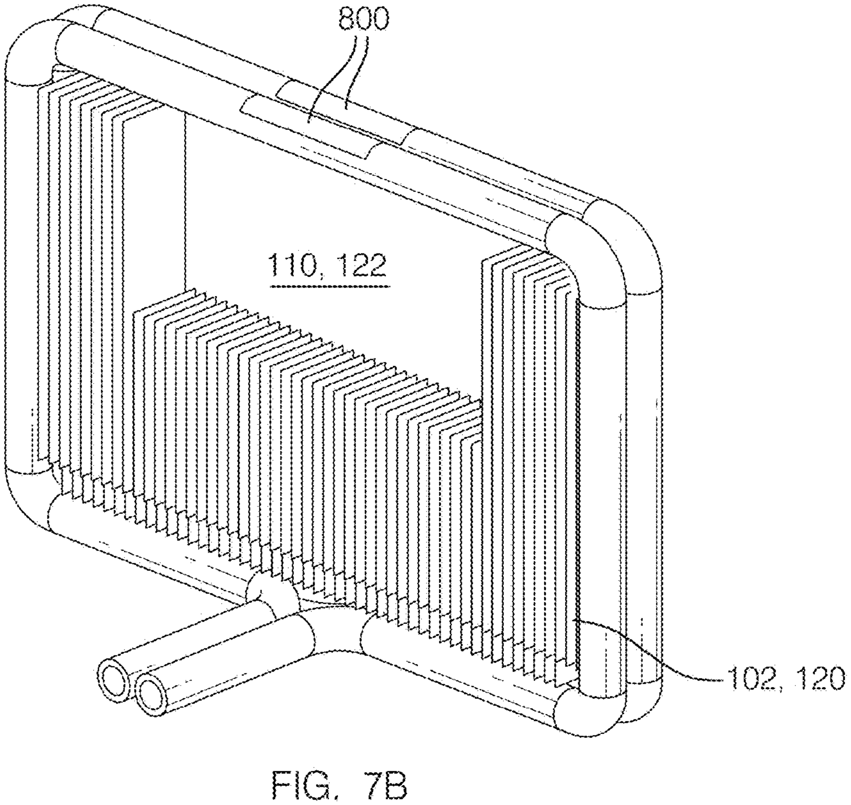
FIG. 7B illustrates central fins positioned within the handle portion of the heat pipes.
Figure 7C:
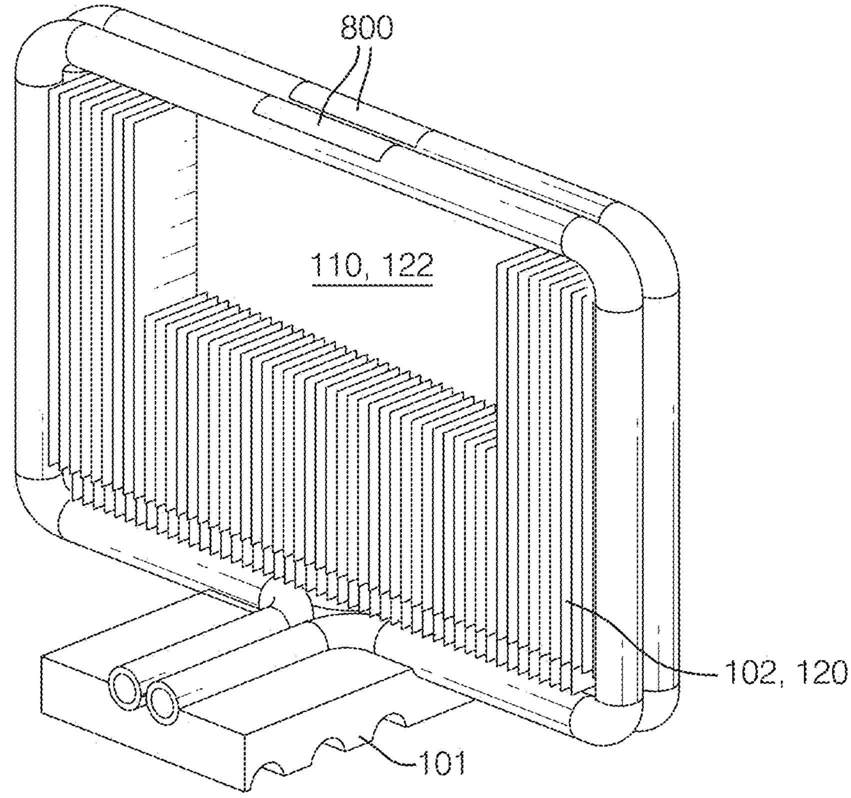
FIG. 7C illustrates a base coupled with the heat pipes with the handle portion.
Figure 7D:
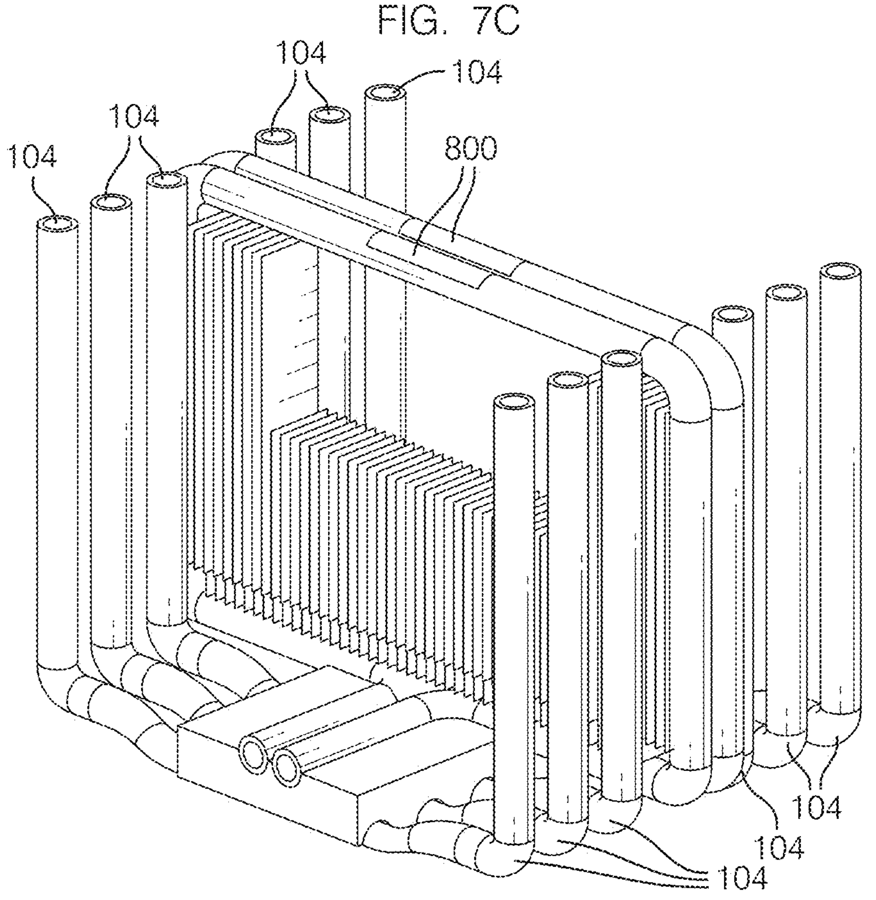
FIG. 7D illustrates heat pipes coupled with the base.
Figure 7E:
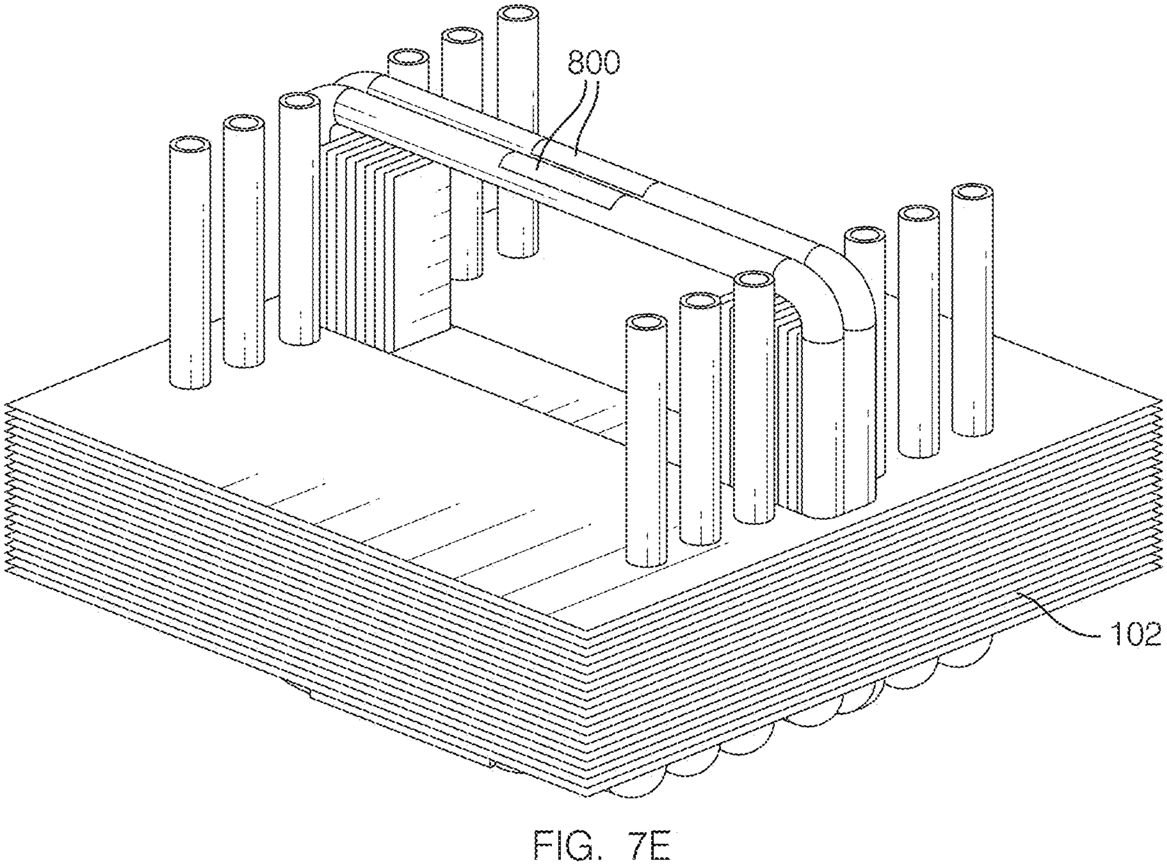
FIG. 7E illustrates a plurality of fins in a stacked configuration received by the heat pipes.

FIGS. 7A-7G illustrate the state of the heat sink 100 during manufacturing. As shown in FIG. 7A, heat pipes 104 that form the handle portion 108 can be provided. In FIG. 7B, central fins 120 can be inserted within the handle portion 108 to form a gap 122 between the handle portion 108 and the central fins 120. In FIG. 7C, the heat pipes 104 that form the handle portion 108 can be coupled with the base 101. In FIG. 7D, a plurality of heat pipes 104 are coupled with the base 101. In FIG. 7E, a first stack of fins 102 is received by the base 101 and/or the heat pipes 104. The first stack of fins 102, similar to the central fins 120, leave a gap 122 between the handle portion 108 and the fins 102.

Figure 7F:
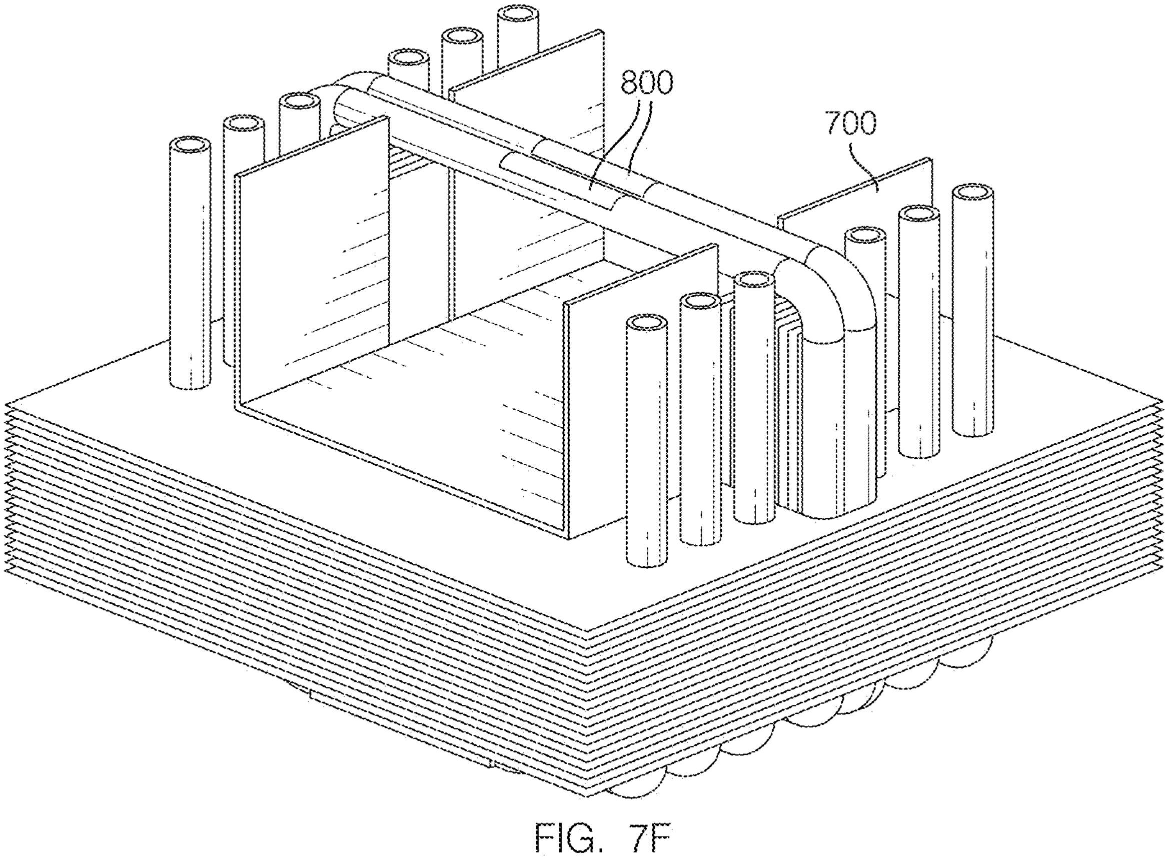
FIG. 7F illustrates a handle plate received in a central aperture.

In FIG. 7F, a handle plate 700 is received in the gap 122 (e.g., that forms the pocket with the central aperture 110) to be positioned between the handle portion 108 and the fins 102. In some examples, the handle plate 700 can be received between the handle portion 108 and the central fins 120. The handle plate 700 can be received in the central aperture 110 and configured such that the handle portion 108 is positioned therein. In some examples, the handle plate 700 can be operable to prevent a user from contacting the fins 102 when grasping the handle portion 108.

Figure 7G:
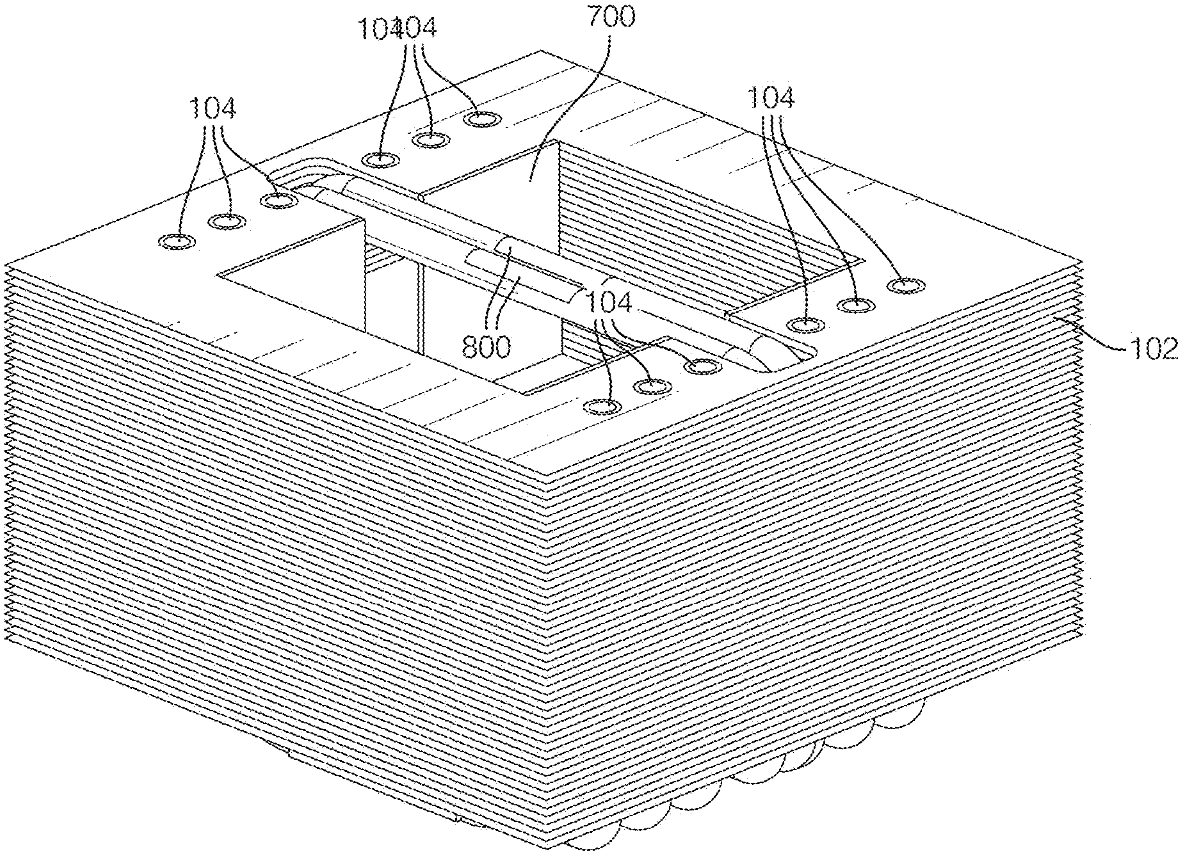
FIG. 7G illustrates a plurality of fins in a stacked configuration received by the heat pipes and the handle plate to form the heat sink with the handle portion.

In FIG. 7G, a second stack of fins 102 is received by the heat pipes 104 and positioned on top of the first stack of fins 102. The second stack of fins 102 can form the central aperture 110 to create the pocket for the handle portion 108.

The heat sink 100 can then be coupled with the computing component 10 of the computing system 50. To reduce the temperature of the computing component 10, the heat sink 100 transfers, by the heat pipes 104 and/or the fins 102, heat from the computing component 10. When needing servicing and/or replacement, the heat sink 100 can be moved via grasping by a user of the handle portion 108.

The handle portion 108, extending across the upper portion of the central aperture 110, is designed such that the temperature of the handle portion 108 is within a limit that is safe to touch when needed. During operation of the computing system 50, the handle portion 108 of the heat pipes 104 may exceed safe touch temperature (e.g., 43 degrees Celsius for continuous touching and 55 degrees Celsius for short periods of touching). However, the temperature of the handle portion 108 lowers once the computing system 50 is turned off and the user is ready to touch the heat sink 100.

To make sure that the handle portion 108 is not too hot to handle, the heat sink 100 can include a heat indicator 800 (shown in FIG. 8) operable to signal when the handle portion 108 is above a threshold temperature (e.g., 43 degrees Celsius or 55 degrees Celsius) so that the user does not grasp the handle portion 108. In some examples, the heat indicator 800 can be operable to indicate to the user when the handle portion 108 is below the threshold temperature to be grasped. In at least one example, the heat indicator 800 can be in communication with the handle portion 108 so that the heat indicator 800 can determine the temperature of the handle portion 108. In some examples, the heat indicator 800 can be disposed on the handle portion 108 so that the user can easily see and determine whether the handle portion 108 can be safely grasped or touched.

Figure 8:
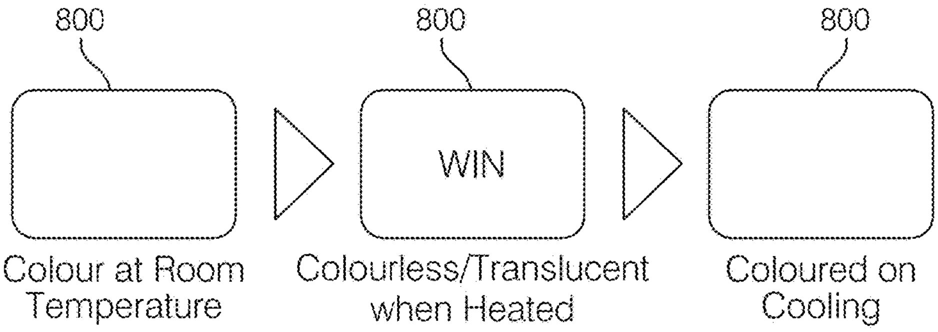
FIG. 8 illustrates a thermochromic indicator.

In at least one example, as illustrated in FIG. 8, the heat indicator 800 can include a thermochromic indicator provided on at least a part of the handle portion 108. The heat indicator 800 can be operable to transition between a first state (e.g., a first color) when a temperature of the handle portion 108 is below the threshold temperature and a second state (e.g., colorless or a second color) when the temperature of the handle portion 108 is above the threshold temperature. In some examples, the heat indicator 800 can include a reversible thermochromic pigment that can change from the first color to the second color (or colorless) when above the threshold temperature and return to the first color when the temperature drops below the threshold temperature.

In some examples, the heat indicator 800 can reveal a message of burn hazard when the temperature of the handle portion 108 is above the threshold temperature (e.g., 55 degrees Celsius).

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A heat sink comprising:

a plurality of heat pipes operable to receive and transfer heat away from a computing component;

a plurality of fins in a stacked configuration, the plurality of fins forming a central aperture extending along a vertical axis, wherein at least one of the plurality of heat pipes includes a handle portion that extends across the central aperture; and a heat indicator operable to indicate to a user when the handle portion is below a threshold temperature.

2. The heat sink of claim 1, wherein the handle portion extends along a horizontal axis transverse to the vertical axis.

3. The heat sink of claim 1, further comprising a base coupled with the plurality of heat pipes, wherein the base is operable to be in contact with the computing component, wherein the base is operable to transfer heat away from the computing component.

4. The heat sink of claim 3, wherein the plurality of fins extends from the base.

5. The heat sink of claim 3, wherein the plurality of heat pipes extends from the base along the vertical axis.

6. The heat sink of claim 1, wherein the plurality of fins includes at least 82 fins in the stacked configuration.

7. The heat sink of claim 1, wherein the heat indicator includes a thermochromic indicator provided on at least a part of the handle portion.

8. The heat sink of claim 7, wherein the thermochromic indicator is operable to at least change between a first color when a temperature of the handle portion is below the threshold temperature and a second color when the temperature of the handle portion is above the threshold temperature.

9. The heat sink of claim 1, further comprising a handle plate operable to be received in the central aperture, the handle plate is configured such that the handle portion is positioned therein.

10. The heat sink of claim 9, wherein the handle plate is operable to prevent a user from contacting the plurality of fins when grasping the handle portion.

11. The heat sink of claim 1, wherein the plurality of fins includes a plurality of central fins operable to be received in the plurality of heat pipes, the plurality of central fins forming a gap underneath the handle portion.

12. A computing system comprising:

a computing component; and a heat sink operable to be in contact with the computing component to transfer heat from the computing component, the heat sink including:

a plurality of heat pipes operable to receive and transfer heat away from the computing component;

a plurality of fins in a stacked configuration, the plurality of fins forming a pocket, wherein at least one of the plurality of heat pipes includes a handle portion that extends across the pocket such that the handle portion is graspable; and a heat indicator operable to signal when the handle portion is above a threshold temperature.

13. The computing system of claim 12, wherein the handle portion extends across an upper portion of the pocket.

14. The computing system of claim 12, wherein the heat sink further includes a base coupled with the plurality of heat pipes, wherein the base is operable to transfer heat from the computing component to the plurality of heat pipes.

15. The computing system of claim 12, wherein the heat indicator is operable to at least transition between a first state when a temperature of the handle portion is below the threshold temperature and a second state when the temperature of the handle portion is above the threshold temperature.

16. The computing system of claim 12, wherein the heat sink further includes a handle plate received in the pocket to be positioned between the handle portion and the plurality of fins.

17. The computing system of claim 12, wherein the handle portion does not extend past a top fin of the plurality of fins.

18. A method comprising:

coupling a heat sink with a computing component of a computing system, the heat sink including: a plurality of heat pipes and a plurality of fins in a stacked configuration, the plurality of fins forming a pocket, wherein:

at least one of the plurality of heat pipes includes a handle portion that extends across the pocket; and the heat sink further comprises a heat indicator operable to signal when the handle portion is above a threshold temperature;

transferring, via the heat sink by the plurality of heat pipes, heat from the computing component; and moving the heat sink via grasping of the handle portion by a user.

* * * * *